(12) United States Patent
Sano et al.

(10) Patent No.: US 10,126,581 B2
(45) Date of Patent: Nov. 13, 2018

(54) DISPLAY DEVICE

(71) Applicant: Japan Display Inc., Minato-ku (JP)

(72) Inventors: Takumi Sano, Tokyo (JP); Yasushi Kawata, Tokyo (JP)

(73) Assignee: Japan Display Inc., Minato-ku (JP)

( * ) Notice: Subject to any disclaimer, the term of this patent is extended or adjusted under 35 U.S.C. 154(b) by 162 days.

(21) Appl. No.: 15/364,497

(22) Filed: Nov. 30, 2016

(65) Prior Publication Data

US 2017/0176808 A1    Jun. 22, 2017

(30) Foreign Application Priority Data

Dec. 16, 2015  (JP) ................................. 2015-245376

(51) Int. Cl.
*G02F 1/1345* (2006.01)
*G02F 1/1333* (2006.01)
(Continued)

(52) U.S. Cl.
CPC ...... *G02F 1/133345* (2013.01); *G02F 1/1339* (2013.01); *G02F 1/13439* (2013.01); *G02F 1/13452* (2013.01); *G02F 1/13454* (2013.01); *G02F 1/13458* (2013.01); *G02F 1/133308* (2013.01); *G02F 1/133512* (2013.01);
(Continued)

(58) Field of Classification Search
CPC .......... G02F 1/133308; G02F 1/13458; G02F 1/13439; G02F 1/134309; G02F 1/1339; G02F 1/133512; G02F 1/133345; G02F 1/13452; G02F 1/13454; G02F 2201/123; G02F 2201/121; G02F 2001/133519; G02F 1/1368; G02F 1/136286; G02F 1/133514; G02F 2001/133368; G02F 2001/133388; H01L 51/56; H01L 51/5246;
(Continued)

(56) References Cited

U.S. PATENT DOCUMENTS

2005/0127818 A1* 6/2005 Ohtani ................ H01L 27/3276
                                                           313/500
2010/0085315 A1* 4/2010 Hsih ..................... G06F 3/0416
                                                           345/173

(Continued)

FOREIGN PATENT DOCUMENTS

JP         09305288 A   * 11/1997  ........... G06F 3/0414
JP         10-104651        4/1998
(Continued)

*Primary Examiner* — Hoan C Nguyen
(74) *Attorney, Agent, or Firm* — Oblon, McClelland, Maier & Neustadt, L.L.P.

(57) ABSTRACT

According to one embodiment, a display device includes a first substrate including a first area, a second area adjacent to the first area, an insulating substrate disposed in the first area and the second area and including a first through hole formed in the second area, a pad electrode formed above the insulating substrate, and a signal line electrically connected to the pad electrode, a wiring substrate including a connection line, the wiring substrate disposed below the insulating substrate, and a conductive material disposed inside the first through hole to electrically connect the pad electrode and the connection line, wherein the insulating substrate becomes thinner in the second area than is in the first area.

14 Claims, 11 Drawing Sheets

(51) Int. Cl.
*G02F 1/1335* (2006.01)
*G02F 1/1339* (2006.01)
*G02F 1/1343* (2006.01)
*H01L 27/32* (2006.01)
*H01L 51/00* (2006.01)
*H01L 51/52* (2006.01)
*H01L 51/56* (2006.01)
*G02F 1/1362* (2006.01)
*G02F 1/1368* (2006.01)

(52) U.S. Cl.
CPC .... *G02F 1/134309* (2013.01); *H01L 27/3276* (2013.01); *H01L 51/0096* (2013.01); *H01L 51/5246* (2013.01); *H01L 51/56* (2013.01); *G02F 1/1368* (2013.01); *G02F 1/133514* (2013.01); *G02F 1/136286* (2013.01); *G02F 2001/133368* (2013.01); *G02F 2001/133388* (2013.01); *G02F 2001/133519* (2013.01); *G02F 2201/121* (2013.01); *G02F 2201/123* (2013.01); *H01L 51/52* (2013.01); *H01L 2227/323* (2013.01); *H01L 2251/558* (2013.01)

(58) Field of Classification Search
CPC . H01L 51/0096; H01L 27/3276; H01L 51/52; H01L 2227/323; H01L 2251/558
USPC .................................................. 349/150–152
See application file for complete search history.

(56) References Cited

U.S. PATENT DOCUMENTS

| | | | |
|---|---|---|---|
| 2011/0180811 A1* | 7/2011 | Suzuki | G06K 19/07745 257/77 |
| 2014/0361183 A1 | 12/2014 | Takeda et al. | |

FOREIGN PATENT DOCUMENTS

| | | | | |
|---|---|---|---|---|
| JP | 10-189863 | 7/1998 | | |
| JP | 2009-237410 | 10/2009 | | |
| JP | 2012220635 A | * 11/2012 | ......... | G02F 1/13452 |
| JP | 2014-236209 | 12/2014 | | |

* cited by examiner

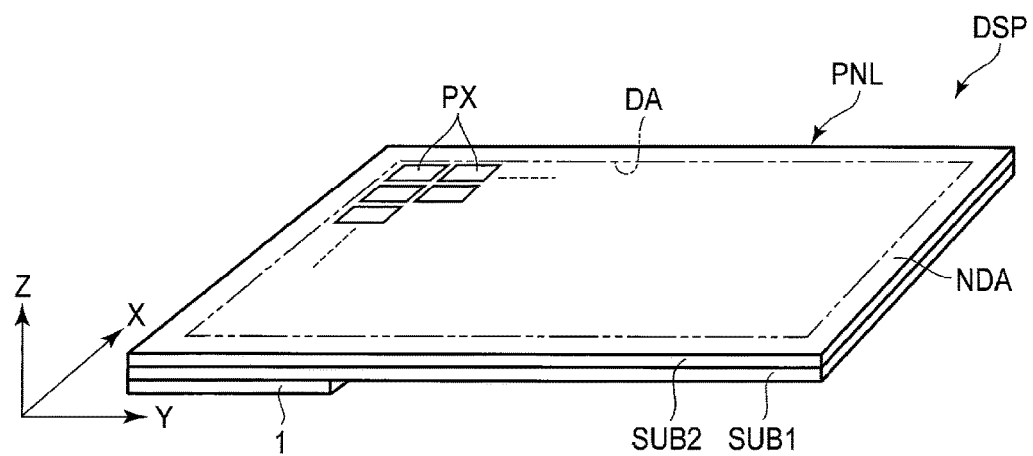
F I G. 1
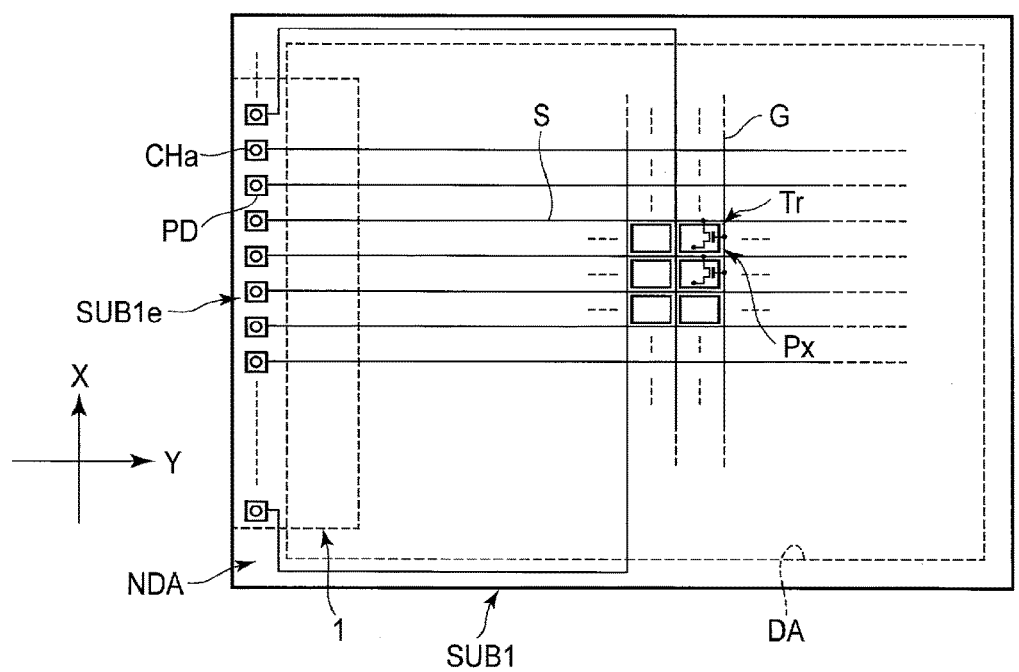
F I G. 2

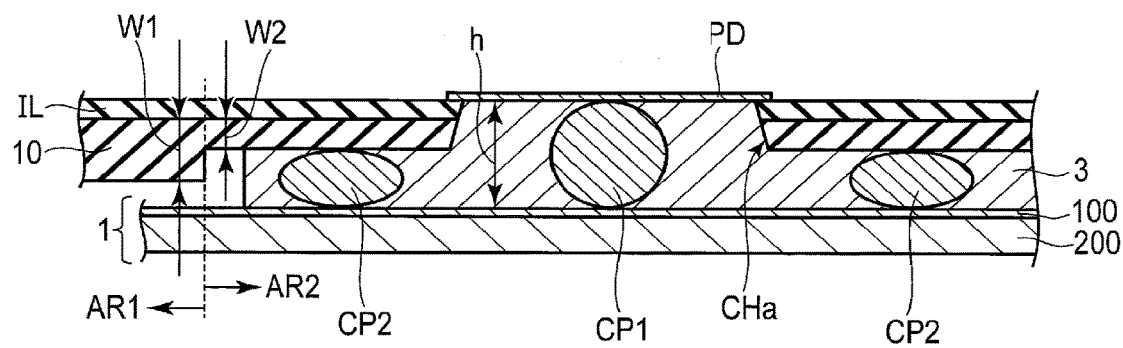
F I G. 5

DISPLAY DEVICE

CROSS-REFERENCE TO RELATED APPLICATIONS

This application is based upon and claims the benefit of priority from Japanese Patent Application No. 2015-245376, filed Dec. 16, 2015, the entire contents of which are incorporated herein by reference.

FIELD

Embodiments described herein relate generally to a display device.

BACKGROUND

In recent years, display devices with a greater display area on the surface are highly anticipated because of higher performance and advanced design in the technical field of mobile data communication devices such as mobile phone and personal digital assistant (PDA). For example, display devices including a thinner bezel structure are proposed.

Conventionally, there is a well-known structure in which a driver is mounted in the periphery of the display area on the substrate including electrodes. In display devices using such a structure of the driver, input signals and voltages are supplied to the driver through a wiring substrate such as a flexible printed circuit (FPC). However, in consideration of greater production and thinner bezel structure, there has been a study to omit such a flexible printed circuit but to achieve an electrical connection between lines formed on the lower surface side of an array substrate and the driver formed on the upper surface side of the array substrate through a contact hole passing through the array substrate.

BRIEF DESCRIPTION OF THE DRAWINGS

FIG. 1 is a schematic perspective view of the structure of a display device of an embodiment.

FIG. 2 is a schematic plan view of the first substrate of the display device of FIG. 1.

FIG. 5 is a cross-sectional view showing a part of the display device DSP of FIG. 4 in an enlarged manner, in which a wiring substrate, anisotropy conductive film, first insulating substrate, insulating film, and pad electrode are depicted.

DETAILED DESCRIPTION

Figure 3:
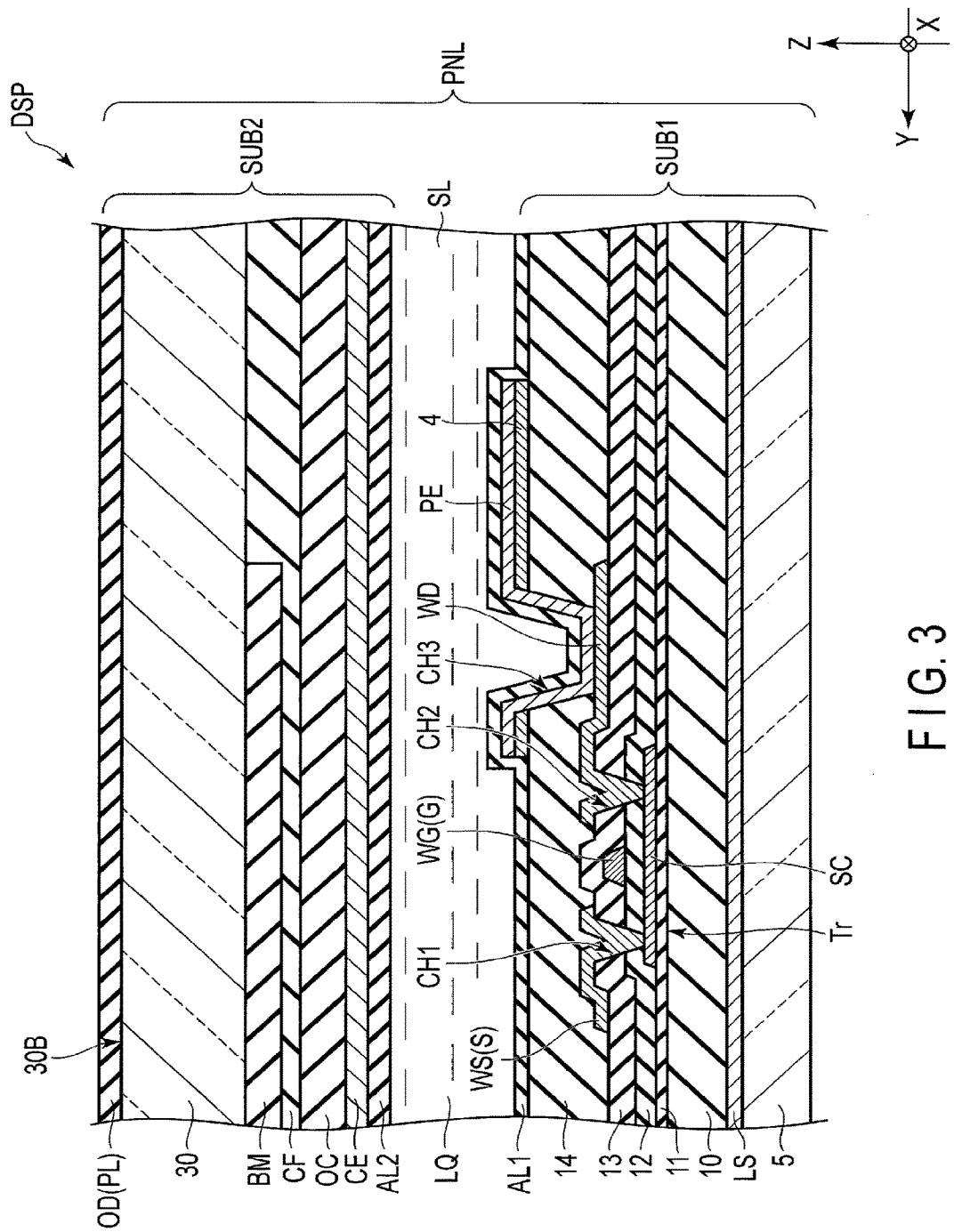
FIG. 3 is a cross-sectional view of a display area of the display device of FIG. 1.

In general, according to one embodiment, a display device includes: a first substrate including a first area, a second area adjacent to the first area, an insulating substrate disposed in the first area and the second area and including a first through hole formed in the second area, a pad electrode formed above the insulating substrate, and a signal line electrically connected to the pad electrode; a wiring substrate including a connection line, the wiring substrate disposed below the insulating substrate; and a conductive material disposed inside the first through hole to electrically connect the pad electrode and the connection line, wherein the insulating substrate becomes thinner in the second area than is in the first area.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc. of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless necessary.

Firstly, a display device of a present embodiment will be explained. FIG. 1 is a schematic perspective view showing the structure of a display device DSP of the present embodiment. FIG. 1 shows a three-dimensional space which is defined by a first direction X, second direction Y which is orthogonal to the first direction X, and third direction Z which is orthogonal to the first direction X and the second direction Y. Note that, in this example, the first direction X and the second direction Y are orthogonal to each other; however, they may cross at an angle other than 90°. Furthermore, in the present embodiment, the display device is a liquid crystal display device.

As shown in FIG. 1, the display device DSP includes a liquid crystal display panel PNL of active matrix type and a wiring substrate 1. The liquid crystal display panel PNL includes a plate-like first substrate SUB1, plate-like second substrate SUB2 opposed to the first substrate SUB1, and liquid crystal layer (liquid crystal layer LQ which will be described later) interposed between the first substrate SUB1 and the second substrate SUB2. Note that the liquid crystal display panel PNL of the present embodiment is a reflective-type liquid crystal display panel.

In the present embodiment, the positive direction of the third direction Z, that is, a direction from the first substrate SUB1 toward the second substrate SUB2 is defined as up or above, and the negative direction of the third direction Z, that is, a direction from the second substrate SUB2 toward the first direction SUB1 is defined as down or below.

The liquid crystal display panel PNL includes a display area DA in which an image is displayed and a non-display area NDA which surrounds the display area DA. The liquid crystal display panel PNL includes a plurality of pixels PX within the display area DA. The pixels PX are arranged in a matrix in the first direction X and the second direction Y.

In the example depicted, a side edge of the first substrate SUB1 which is parallel to the first direction X and a side edge of the second substrate SUB2 which is parallel to the first direction X have a substantially same length. Furthermore, a side edge of the first substrate SUB1 which is parallel to the second direction Y and a side edge of the second substrate SUB2 which is parallel to the second direction Y have a substantially same length. That is, an area of the first substrate SUB1 which is parallel to the X-Y plane is substantially the same as an area of the second substrate SUB2 in the X-Y plane. In the present embodiment, each side edge of the first substrate SUB1 matches each corresponding edge of the second substrate SUB2 in the third direction Z.

The wiring substrate 1 is disposed below the liquid crystal display panel PNL. In this example, a side edge of the wiring substrate 1 which is parallel to the first direction X has a length shorter than or equal to the side edges of the first substrate SUB1 and the second substrate SUB2 which are parallel to the first direction X. Furthermore, a side edge of the wiring substrate 1 which is parallel to the second direction Y has a length shorter than or equal to the side edges the first substrate SUB1 and the second substrate SUB2 which are parallel to the second direction Y. The wiring substrate 1 is disposed in both the non-display area NDA and the display area DA. In the present embodiment, a side edge of the wiring substrate 1 which is parallel to the first direction X matches an end of the liquid crystal display panel PNL in the third direction Z. Note that the wiring substrate 1 does not go outside the area opposed to the liquid crystal display panel PNL. The liquid crystal display panel PNL and the wiring substrate 1 are electrically connected to each other.

FIG. 2 is a schematic plan view of the first substrate SUB1 of the display device DSP of FIG. 1. As shown in FIG. 2, the first substrate SUB1 includes, in the display area DA, a plurality of gate lines G extending in the first direction X and arranged in the second direction Y, a plurality of source lines S extending in the second direction Y and arranged in the first direction X, and a thin film transistor Tr which is electrically connected to a gate line G and a source line S in each pixel PX. Each pixel PX is defined by two adjacent gate lines G and two adjacent source lines S. The thin film transistor Tr functions as a switching element.

The first substrate SUB1 includes an edge SUB1e in the non-display area NDA, in which a plurality of pad electrodes PD and a plurality of contact holes CHa are formed. Each pad electrode PD is formed to overlap a corresponding contact hole CHa. Each of the source lines S and the gate lines G is drawn to the non-display area NDA and is electrically connected to a corresponding pad electrode PD. The wiring substrate 1 is formed to at least partially overlap the edge SUB1e of the first substrate SUB1 as depicted with the dotted line in the figure. The wiring substrate 1 is, as described later, electrically connected to the pad electrode PD through the conductive material (which is not shown) in the contact holes CHa.

FIG. 3 is a cross-sectional view of the display area DA of the display device DSP of FIG. 1. Note that the example depicted in FIG. 3 shows a reflective liquid crystal display device using a twisted nematic (TN) mode.

As shown in FIG. 3, the first substrate SUB1 includes, for example, a support substrate 5, light shielding mask (light shield) LS, first insulating substrate 10, thin film transistor Tr, reflective layer 4, pixel electrode PE, and first alignment film AL1. The support substrate 5 is, for example, a glass substrate. The light shielding mask LS is disposed on the support substrate 5. The light shielding mask LS shields a laser beam. In the present embodiment, the light shielding mask LS is formed of a material which reflects a laser beam, and such a material reflects excimer laser or the like. The first insulating substrate 10 is disposed above the support substrate 5 and the light shielding mask LS. That is, the light shielding mask LS is disposed between the support substrate 5 and the first insulating substrate 10. The first insulating substrate 10 is formed of an organic insulating material such as polyimide. The first insulating substrate 10 is covered with a first insulating film 11.

The thin film transistor Tr is disposed above the first insulating film 11. In the example depicted, the thin film transistor Tr is structured top-gate type; however, it may be formed bottom-gate type. The thin film transistor Tr includes a semiconductor layer SC formed on the first insulating film 11. The semiconductor layer SC is covered with a second insulating film 12. The second insulating film 12 is disposed above the first insulating film 11.

A gate electrode WG of the thin film transistor Tr is formed on the second insulating film 12 to be directly above the semiconductor layer SC. The gate electrode WG is electrically connected to a gate line G (or formed integrally with the gate line G) and is covered with a third insulating film 13. Furthermore, the third insulating film 13 is disposed above the second insulating film 12.

The first insulating film 11, second insulating film 12, and third insulating film 13 are formed of an inorganic material such as silicon oxide or silicon nitride.

A source electrode WS and a drain electrode WD are formed on the thin film transistor Tr. Furthermore, the source line S is formed on the third insulating film 13. The source electrode WS is electrically connected to the source line S (or formed integrally with the source line S). The source electrode WS and the drain electrode WD are electrically connected to the semiconductor layer SC through contact holes CH1 and CH2 passing through the second insulating film 12 and the third insulating film 13. The thin film transistor Tr is covered with a fourth insulating film 14. The fourth insulating film 14 is disposed above the third insulating film 13. The fourth insulating film 14 is formed of an organic material such as transparent resin.

The reflective layer 4 is formed on the fourth insulating film 14. The reflective layer 4 is formed of a highly reflective metal material such as aluminum and silver. Note that the surface of the reflective layer 4 (that is, the surface in the second substrate SUB2 side) has an asperity for light dispersion.

The pixel electrode PE is formed on the fourth insulating film 14, and in the example depicted, it overlaps the reflective layer 4. Note that the reflective layer 4 can be formed at any position as long as it is opposed to the pixel electrode PE, and a different insulating film may be interposed between the pixel electrode PE and the reflective layer 4. The pixel electrode PE contacts the drain electrode WD of the thin film transistor Tr through a contact hole CH3 which passes through the fourth insulating film 14. The pixel electrode PE is formed of a transparent conductive material such as indium tin oxide (ITO) or indium zinc oxide (IZO). The pixel electrode PE is covered with the first alignment film AL1.

On the other hand, the second substrate SUB2 is disposed above the first substrate SUB1 and is opposed to the first substrate SUB1. The second substrate SUB2 includes, for example, a second insulating substrate 30, light shielding layer BM, color filter CF, overcoat layer OC, common electrode CE, second alignment film AL2. The second insulating substrate 30 is formed of a light transmissive material such as a glass substrate or a resin substrate.

The light shielding layer BM is formed on the second insulating substrate 30 to be opposed to the first substrate SUB1. The light shielding layer BM is formed to define each pixel PX to be opposed to the gate line G, and the source line S of the first substrate SUB1, the lines of the thin film transistor Tr, and contact hole CH3. The light shielding layer BM is formed of a light shielding metal material or a black resin material.

The color filter CF is formed on the second insulating substrate 30 to be opposed to the first substrate SUB1 and partly overlaps the light shielding layer BM. Color filters CF are formed of resin materials of different colors such as red, blue, and green. A red color filter corresponds to a red pixel, a green color filter corresponds to a green color pixel, and a blue color filter corresponds to a blue color pixel. Note that color filters CF may further include a white or a transparent color filter. Each boundary between color filters CF of different colors is disposed to be opposed to a light shielding layer BM.

The overcoat layer OC covers the color filter CF. The overcoat layer OC is formed of a transparent resin material.

The common electrode CE is formed on the overcoat layer OC to be opposed to the first substrate SUB1. The common electrode is formed of a transparent conductive material such as ITO or IZO. The common electrode CE is covered with the second alignment film AL2.

In the above-explained relationship of the first substrate SUB1 and the second substrate SUB2, the first alignment film AL1 and the second alignment film AL2 are disposed to be opposed to each other. Therein, a certain cell gap is formed between the first substrate SUB1 and the second substrate SUB2 with spacers (which are not shown). The first substrate SUB1 and the second substrate SUB2 are adhered together by a sealant (which is not shown) with a cell gap formed therebetween. The liquid crystal layer LQ is sealed within the first alignment film AL1 and the second alignment film AL2. An optical element OD including a polarizer PL is disposed on the external surface 30B of the second insulating substrate 30. The optical element OD is disposed in the display surface side.

Figure 4:
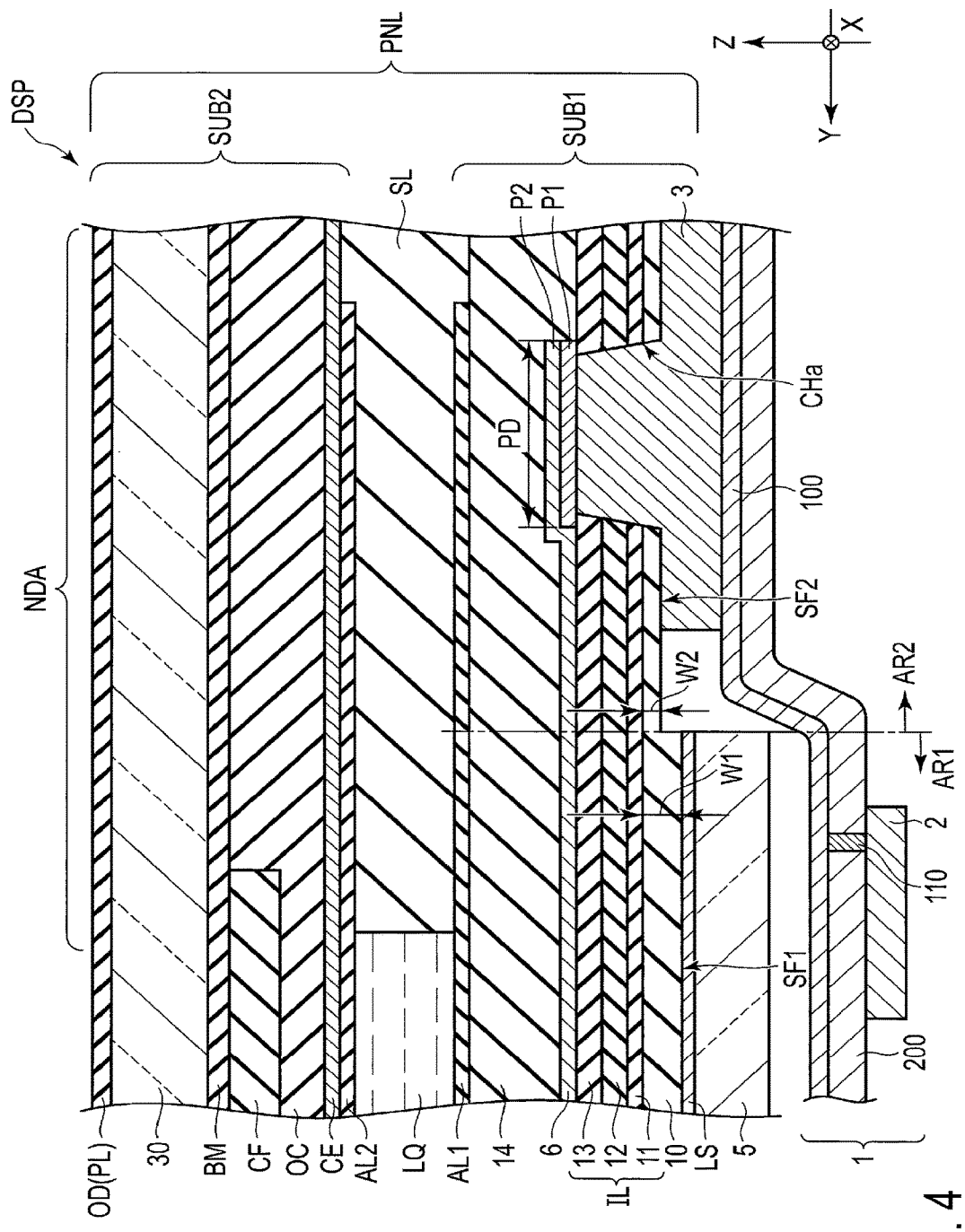
FIG. 4 is a cross-sectional view of the display device of FIG. 1 including a non-display area.

FIG. 4 is a cross-sectional view of the display device DSP of FIG. 1 including the non-display area NDA. Note that the second substrate SUB2 here is structured substantially the same as the second substrate SUB2 of FIG. 3, and the detailed description thereof will be omitted. Furthermore, a view of the first substrate SUB1 from the second substrate SUB2 side is defined as a plan view.

As shown in FIG. 4, the first substrate SUB1 and the second substrate SUB2 are adhered by a sealant SL. The liquid crystal layer LQ is disposed between the first substrate SUB1 and the second substrate SUB2 inside the area surrounded by the sealant SL. The sealant SL is formed in the non-display area NDA.

The support substrate 5 and the light shielding mask LS do not extend to the edge of the first substrate SUB1 and are cut halfway. That is, the support substrate 5 and the light shielding mask LS do not extend to the side edge of the first substrate SUB1 in the edge SUB1e side, which is shown in FIG. 2. Here, the first substrate SUB1 includes a first area AR1 and a second area AR2. The first area AR1, in a plan view, corresponds to the area where the support substrate 5 and the light shielding mask LS are disposed, and the second area AR2, in a plan view, corresponds to the area where the support substrate 5 and the light shielding mask LS are not disposed. The support substrate 5 and the light shielding mask LS overlap a part of the sealant SL in a plan view. The sealant SL is formed over the boundary of the first area AR1 and the second area AR2.

The first insulating substrate 10 has a thickness W1 in the first area AR1 and a thickness W2 in the second area AR2. The thickness W2 is less than the thickness W1. In the embodiment, the thickness W1 is approximately 10 µm, and the thickness W2 is 1 µm or less, for example.

The pad electrode PD is formed above the first insulating substrate 10. In the example depicted, the first insulating film 11, second insulating film 12, and third insulating film 13 are disposed between the pad electrode PD and the first insulating substrate 10. Here, the insulating films disposed between the first insulating substrate 10 and the pad electrode PD are referred to as an insulating film IL. In the example depicted, the first insulating film 11, second insulating film 12, and third insulating film 13 correspond to the insulating film IL. As described above, the first insulating film 11, second insulating film 12, and third insulating film 13 are formed of inorganic materials such as silicon oxide and silicon nitride, and the insulating film IL is an inorganic insulating film. The insulating film IL is a multilayer film including at least a first insulating film 11 and a second insulating film 12 which are formed of different materials. For example, the first insulating film 11 is formed of silicon oxide and the second insulating film 12 is formed of silicon nitride.

Furthermore, in the example depicted, the pad electrode PD is a multilayer including electrodes P1 and P2. The electrode P1 is a transparent conductive layer formed of, for example, indium tin oxide as a transparent conductive material. The electrode P2 is disposed above the electrode P1 and is formed of a conductive material such as a metal material. The electrode P2 is formed in, for example, an island shape. A contact hole CHa is formed passing through the first insulating substrate 10 and the insulating film IL to reach the pad electrode PD. The pad electrode PD is formed in a position opposed to the contact hole CHa. The pad electrode PD and the contact hole CHa are, in a plan view, formed in the second area AR2 of the first substrate SUB1. Furthermore, the contact hole CHa is, in a plan view, formed at a position overlapping the sealant SL. Note that, in the present embodiment, the contact hole CHa corresponds to a through hole passing through the first insulating substrate 10 and the insulating film IL to reach the pad electrode PD.

The signal line 6 is, in the example depicted, formed on the third insulating film 13 and is formed in the same layer where the pad electrode PD is disposed. The signal line 6 is electrically connected to the pad electrode PD. The signal line 6 and the pad electrode PD may be formed separately or integrally. In the example depicted, the signal line 6 is formed integrally with the electrode P2 of the pad electrode PD. The signal line 6 corresponds to the gate line G and source line S of FIG. 2, a power source line, and various control lines. The fourth insulating film 14 covers the signal line 6, pad electrode PD, and third insulating film 13.

Note that, in the example depicted, the signal line 6 and the pad electrode PD are disposed in the same layer where the source line S is disposed; however, they may be disposed in a different layer. Furthermore, the signal line 6 and the pad electrode PD may be formed in different layers such that the signal line 6 and the pad electrode PD are electrically connected through a contact hole formed in an interlayer insulating film therebetween.

The wiring substrate 1 includes a core substrate 200, a connection line 100 disposed on the surface of the core substrate 200 to be opposed to the liquid crystal display panel PNL, and driver 2 disposed on the surface opposite to the surface of the core substrate 200 to be opposed to the liquid crystal display panel PNL.

The driver 2 is electrically connected to the connection line 100 through a through hole 110 formed in the core substrate 200. The driver 2 functions as, for example, a signal supplier which supplies a signal to the liquid crystal display panel PNL for its drive. Note that the position of the driver 2 is not limited to the above, and it may be disposed on the surface of the core substrate 200 which is opposed to the liquid crystal display panel PNL.

The liquid crystal display panel PNL and the wiring substrate 1 are electrically connected and adhered together with an anisotropy conductive film 3 which is a conductive material. Specifically, the anisotropy conductive film 3 includes conductive particles (conductive materials CP which will be described later) dispersed in an adhesive agent. When the anisotropy conductive film 3 is interposed between the wiring substrate 1 and the liquid crystal display panel PNL, they are pressed vertically in the third direction Z and heated to achieve electrical and physical connection therebetween. The anisotropy conductive film 3 is, between the liquid crystal display panel PNL and the wiring substrate 1, filled inside the contact hole CHa from the lower surface of the first insulating substrate 10 to contact and electrically connect with the first electrode P1 of the pad electrode PD. Furthermore, the anisotropy conductive film 3 contacts and electrically connects with the projection T of the connection line 100. Thereby, the connection line 100 is electrically connected to the pad electrode PD and the signal line 6 through the anisotropy conductive film 3. Note that the surface of the connection line 100 which contacts the anisotropy conductive film 3 is flat.

Furthermore, the sealant SL is, in a plan view, formed in a position overlapping the contact hole CHa. Thus, the sealant SL positioned as above is effective for firm connection between the wiring substrate 1 and the liquid crystal display panel PNL. Note that the lower surface SF1 of the first insulating substrate 10 in the first area AR1 contacts the light shield LS and the lower surface SF2 of the first insulating substrate 10 in the second area AR2 contacts the anisotropy conductive film 3.

FIG. 5 is a cross-sectional view showing a part of the display device DSP of FIG. 4 in an enlarged manner, in which the wiring substrate 1, anisotropy conductive film 3, first insulating substrate 10, insulating film IL, and pad electrode PD are depicted.

As shown in FIG. 5, a conductive particle CP1 in the anisotropy film 3 is interposed between the pad electrode PD and the connection line 100 in the contact hole CHa. When the wiring substrate 1 is pressed against the liquid crystal display panel PNL, The conductive particle CP1 is crushed between the connection line 100 and the pad electrode PD to establish electrical connection therebetween. At that time, a height h between the connection line 100 and the pad electrode PD decreases to sufficiently crush the conductive particle CP1. Furthermore, in the example depicted, conductive particles CP2 in the anisotropy conductive film 3 in the second area AR2 are interposed between the first insulating substrate 10 and the connection line 110 outside the contact hole CHa. In this state, the conductive particles CP2 may be lodged in between the first insulating substrate 10 and the connection line 100. In the present embodiment, a state where the conductive particles CP2 are lodged means that the conductive particles CP2 are not pressed any further by the pressure applied to the conductive particles CP2 when the wiring substrate 1 and the liquid crystal display panel PNL are adhered together by pressing. The conductive particles CP1 and CP2 may be, for example, entirely formed of a metal or may be formed of a resin material coated with a metal material such as nickel or gold.

Note that, between the wiring substrate 1 and the liquid crystal display panel PNL, two or more conductive particles CP are not made conductive while being stacked in the third direction Z. Furthermore, for example, in both the first direction X and second direction Y, an adhesive agent (insulative material) which is a material for the anisotropy conductive film 3 is filled between adjacent conductive particles CP, and thus, the conductive particles CP are rarely made conductive in both the first direction X and second direction Y.

In the present embodiment, the first insulating substrate 10 is thinner in the second area AR2 than is in the first area AR1. Therefore, even if the conductive particles CP2 are interposed and pressed between the connection line 100 and the first insulating substrate 10, the height h between the pad electrode PD and the connection line 100 in a position opposed to the contact hole CHa can be decreased to sufficiently press the conductive particle CP1. That is, the conductive particle CP1 between the connection line 100 and the pad electrode PD can be pressed and crushed before the conductive particles CP2 are lodged between the connection line 100 and the first insulating substrate 10. Thus, the connection between the connection line 100 and the pad electrode PD can be established more efficiently.

Furthermore, in the present embodiment, the display device DSP includes the wiring substrate 1 disposed below the liquid crystal display panel PNL (in the rear surface side which is opposite to the display surface) wherein the wiring substrate 1 and the liquid crystal display panel PNL are electrically connected through the conductive material (anisotropy conductive film 3 in the above example) in the contact hole CHa in the second area AR2. Furthermore, the driver 2 is disposed below the liquid crystal display panel PNL. Since the area of the first substrate SUB1 is not required to be enlarged to mount the driver 2 or the wiring substrate 1 thereon, the first substrate SUB1 and the second substrate SUB2 can be formed substantially even. Furthermore, in the area where the first substrate SUB1 and the second substrate SUB2 are opposed to each other, the active area ACT can be increased. That is, in the display surface of the display device DSP of the present embodiment, the area of the active area ACT used for display can be increased, and a thinner bezel structure can be achieved.

Furthermore, since there is no need of a long flexible printed circuit used for the electrical connection between the part of the first substrate SUB1 which is opposed to the second substrate SUB2 and the wiring substrate 1, or a space to accommodate a bent flexible printed circuit, the display device DSP can be miniaturized. Furthermore, an electronic device including the display device DSP can be miniaturized, too.

Furthermore, since a possible breakdown of the lines when the flexible printed circuit is bent can be avoided, the display device DSP can be more reliable.

Furthermore, the contact hole CHa is formed to be opposed to the sealant SL. Since the sealant SL contains a solid substance such as fiber, a bezel area PRP including the sealant SL can be formed stronger with respect to a force in the third direction Z of the liquid crystal display panel PNL as compared to the active area ACT. That is, when the wiring substrate 1 is pressed to the liquid crystal display panel PNL, damage to the liquid crystal display panel PNL caused of the force in the third direction Z can be suppressed.

Figure 6:
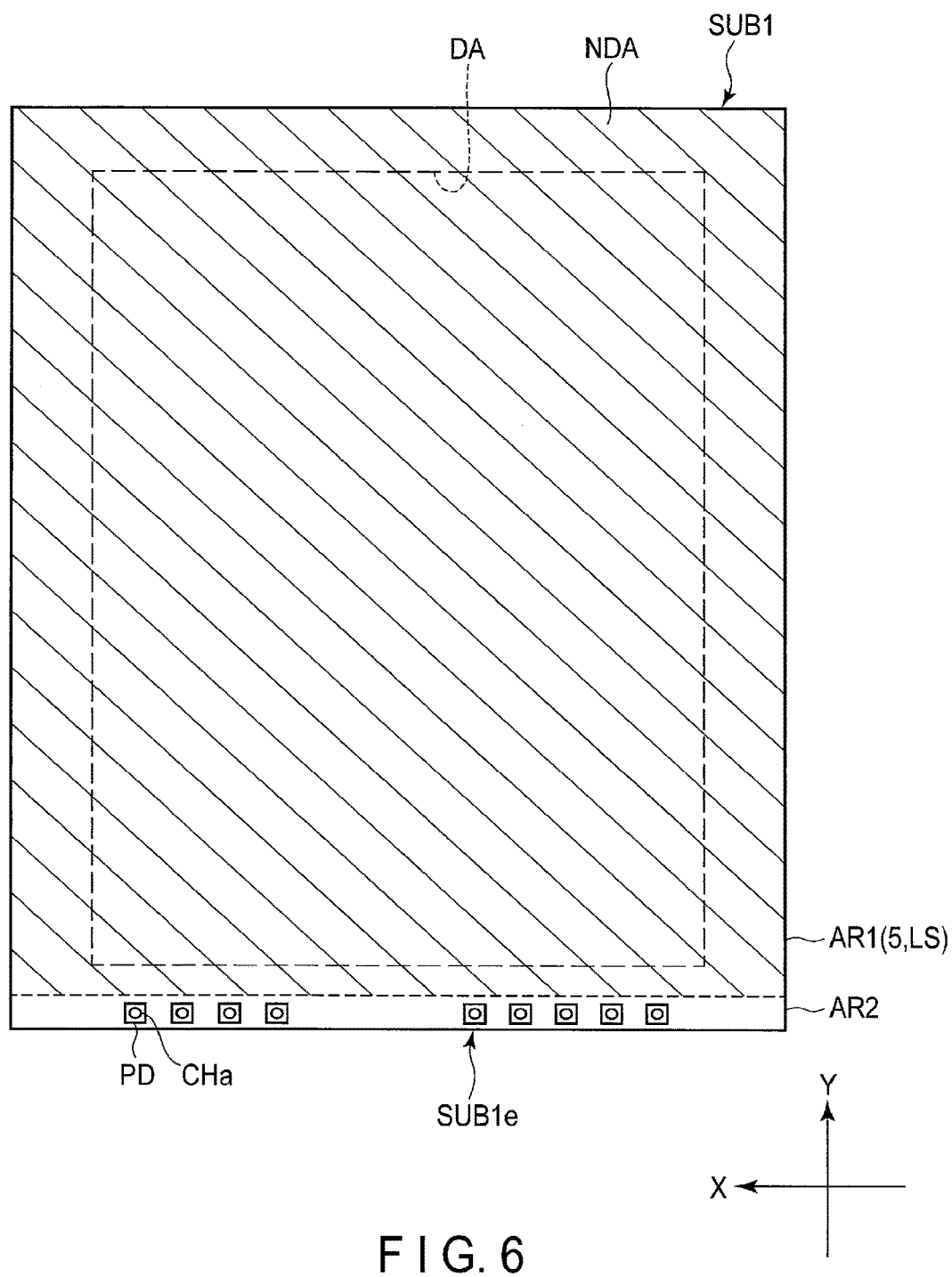
FIG. 6 is a plan view of the first substrate of the embodiment, in which positions of a first area and a second area or the like are depicted.

FIG. 6 is a plan view of the first substrate SUB1 of the embodiment, in which positions of the first area AR1 and the second area AR2 or the like are depicted.

In FIG. 6, the first area AR1 is hatched. The support substrate 5 and the light shielding mask LS are disposed over the entirety of the first area AR1. The second area AR2 is adjacent to the first area AR1 and extends in the first direction X in the non-display area NDA in one end SUB1e side of the first substrate SUB1. Pad electrodes PD and contact holes CHa are arranged in the first direction X in the second area AR2.

Note that the first insulating substrate 10 of FIG. 4 is arranged over the entirety of the liquid crystal display panel PNL. Furthermore, as explained above, the thickness W2 is less than the thickness W1. That is, the pad electrode PD and the contact hole Cha are disposed in the first insulating substrate where its thickness becomes small.

Now, a manufacturing method of the display device DSP of the present embodiment will be explained with reference to FIGS. 7 to 10. FIGS. 7 to 10 are schematic cross-sectional views each showing a method of pressing the wiring substrate 1 to the liquid crystal display panel PNL in the present embodiment. The structure above the pad electrode PD shown in FIGS. 7 to 10 is the same as that of the liquid crystal display panel PNL of FIG. 4A.

Figure 7:
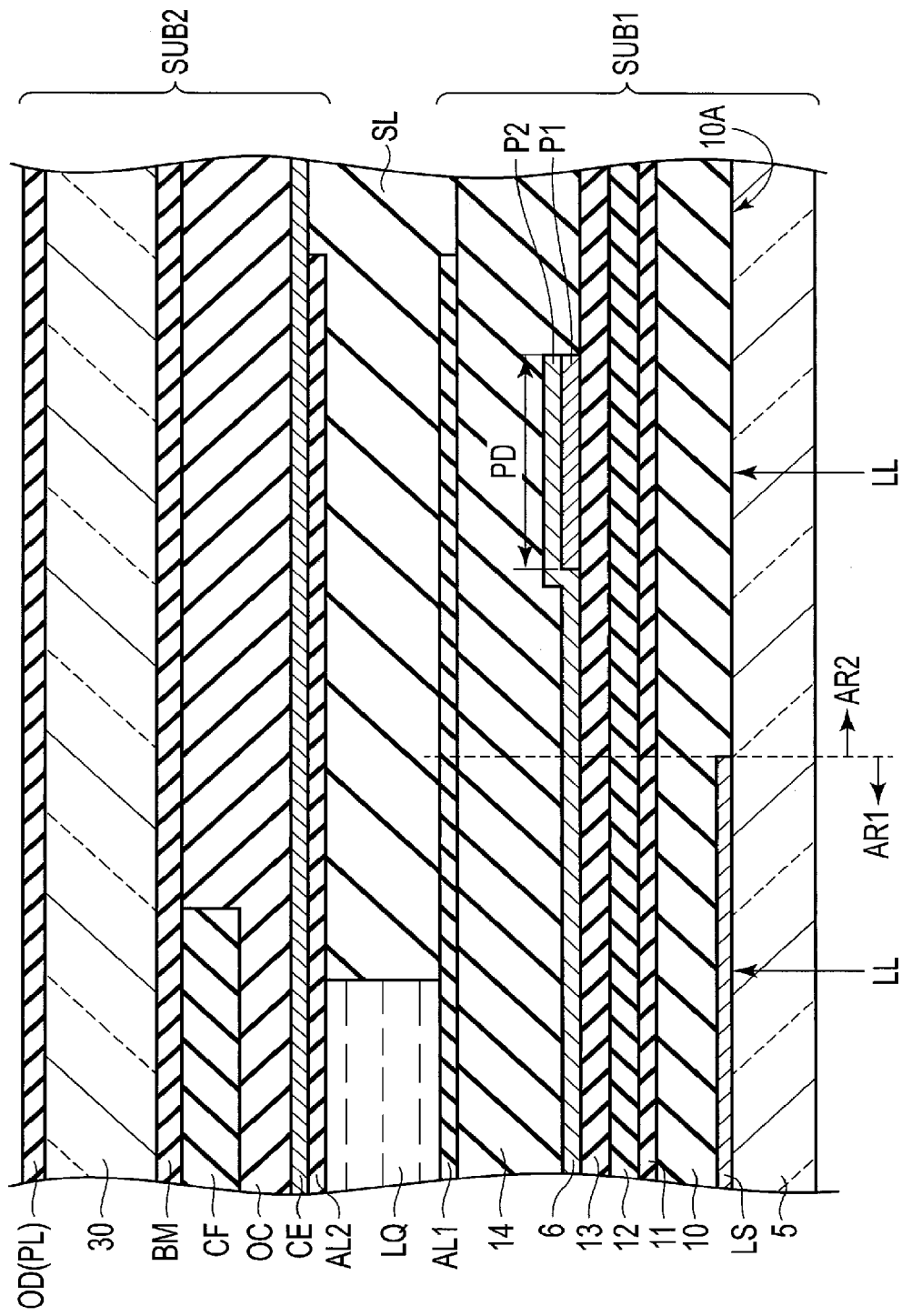
FIG. 7 is a cross-sectional view showing a first process in which the first substrate and the second substrate of the above embodiment are adhered together.

FIG. 7 is a cross-sectional view showing a first process in which the first substrate SUB1 and the second substrate SUB2 of the above embodiment are adhered together.

As shown in FIG. 7, the light shielding mask LS is initially formed on the support substrate 5. The light shielding mask LS is formed in the first area AR1 of the first substrate SUB1. By applying an organic insulating film on the support substrate 5 and the light shielding mask LS, a first insulating substrate 10 is formed. Then, the first insulating film 11, second insulating film 12, third insulating film 13, pad electrode PD, signal line 6, fourth insulating film 14, and first alignment film AL1, etc. are formed one after another to form the first substrate SUB1. The second substrate SUB2 is formed, too.

Then, the sealant SL is formed on the first substrate SUB1 or the second substrate SUB2. A liquid crystal material is dropped into the area surrounded by the sealant SL, and the first substrate SUB1 and the second substrate SUB2 are adhered together.

Then, laser LL is irradiated from the rear surface side of the support substrate 5 to partly peel the support substrate 5 from the first insulating substrate 10. Here, in the present embodiment, the support substrate 5 is formed of glass and the first insulating substrate 10 is formed of polyimide. The laser LL irradiated from the rear surface side of the support substrate 5 reaches the surface 10A of the first insulating substrate 10 in the second area AR2. The first insulating substrate 10 absorbs and resolves the laser LL at the interface between the support substrate 5 and the first insulating substrate 10. Thereby, a space is created at the interface between the support substrate 5 and the first insulating substrate 10. At that time, the laser LL does not reach the surface 10A of the first insulating substrate 10 by the light shielding mask LS in the first area AR1, and thus, the interface between the first insulating substrate 10 and the light shielding mask LS is not peeled off.

Figure 8:
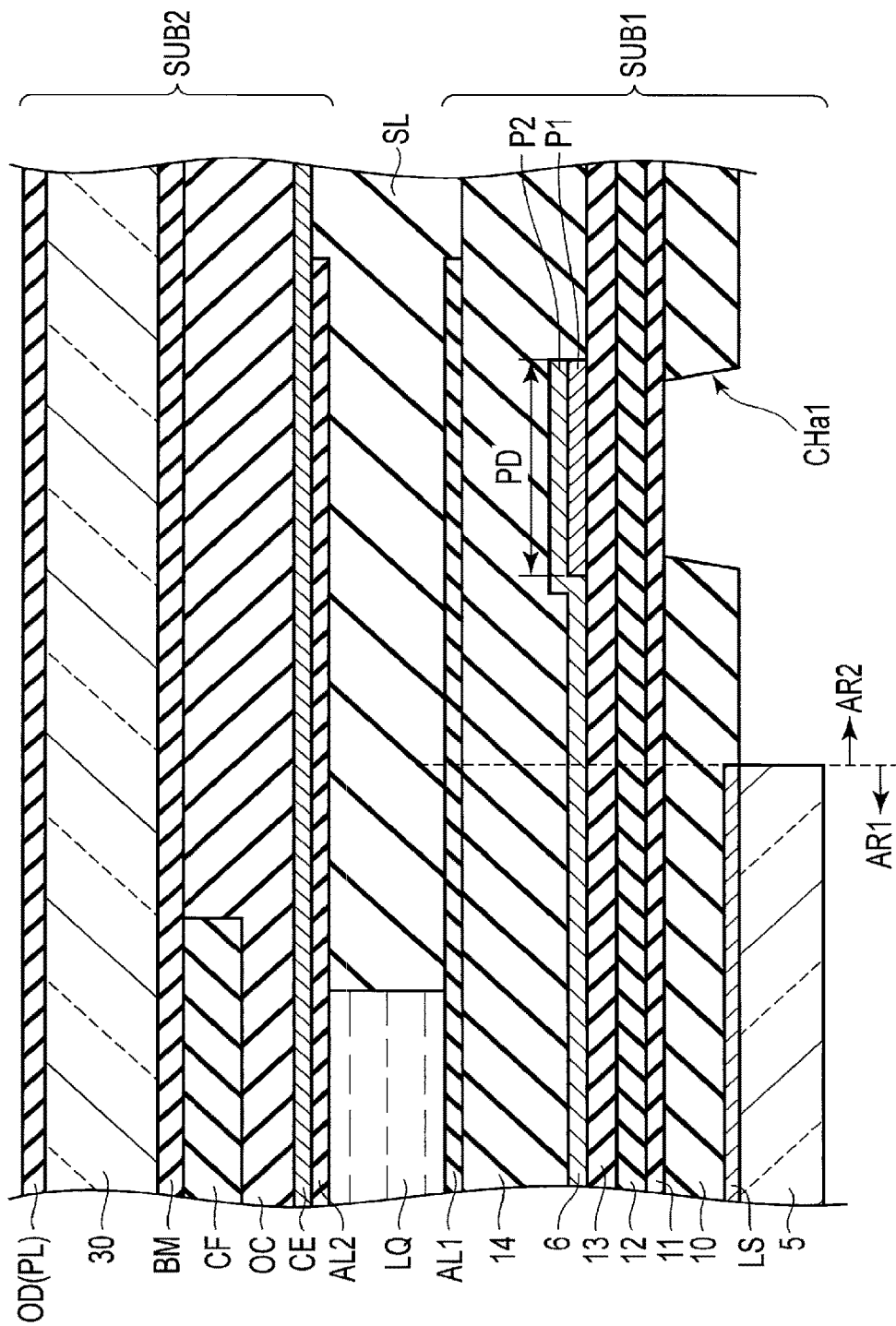
FIG. 8 is a cross-sectional view showing a second process in which a support substrate is partly peeled off from a first insulating substrate and a first contact hole is formed in the first substrate after the first process of FIG. 7.

FIG. 8 is a cross-sectional view showing a second process in which the support substrate 5 is partly peeled off from the first insulating substrate 10 and a first contact hole CHa1 is formed in the first substrate SUB1 after the first process of FIG. 7.

As shown in FIG. 8, after the laser irradiation, the support substrate 5 is fixed to the first insulating substrate 10 through the light shielding mask LS in the first area AR1 while the support substrate 5 is detached from the first insulating substrate 10 in the second area AR2. Then, the support substrate 5 is cut at the boundary between the first area AR1 and the second area AR2 to remove the support substrate 5 from the second area AR2. Note that the position of cutting the support substrate 5 is not limited to the position opposed to the end of the light shielding mask LS. For example, the support substrate 5 may be cut at a position which is apart from the end of the light shielding mask LS and is not opposed to the light shielding mask LS.

After the support substrate 5 is detached from the first insulating substrate in the second area AR2, the first contact hole CHa1 is formed in the first substrate SUB1. Specifically, laser is irradiated from the lower side of the first substrate SUB1 toward the area overlapping the sealant SL, the first contact hole CHa1 is formed through the first insulating film 11, second insulating film 12, third insulating film 13 to reach the contact hole CHa. In the present embodiment, laser with a wavelength of 258 nm or less should be used. The first contact hole CHa1 functions as a first through hole.

Figure 9:
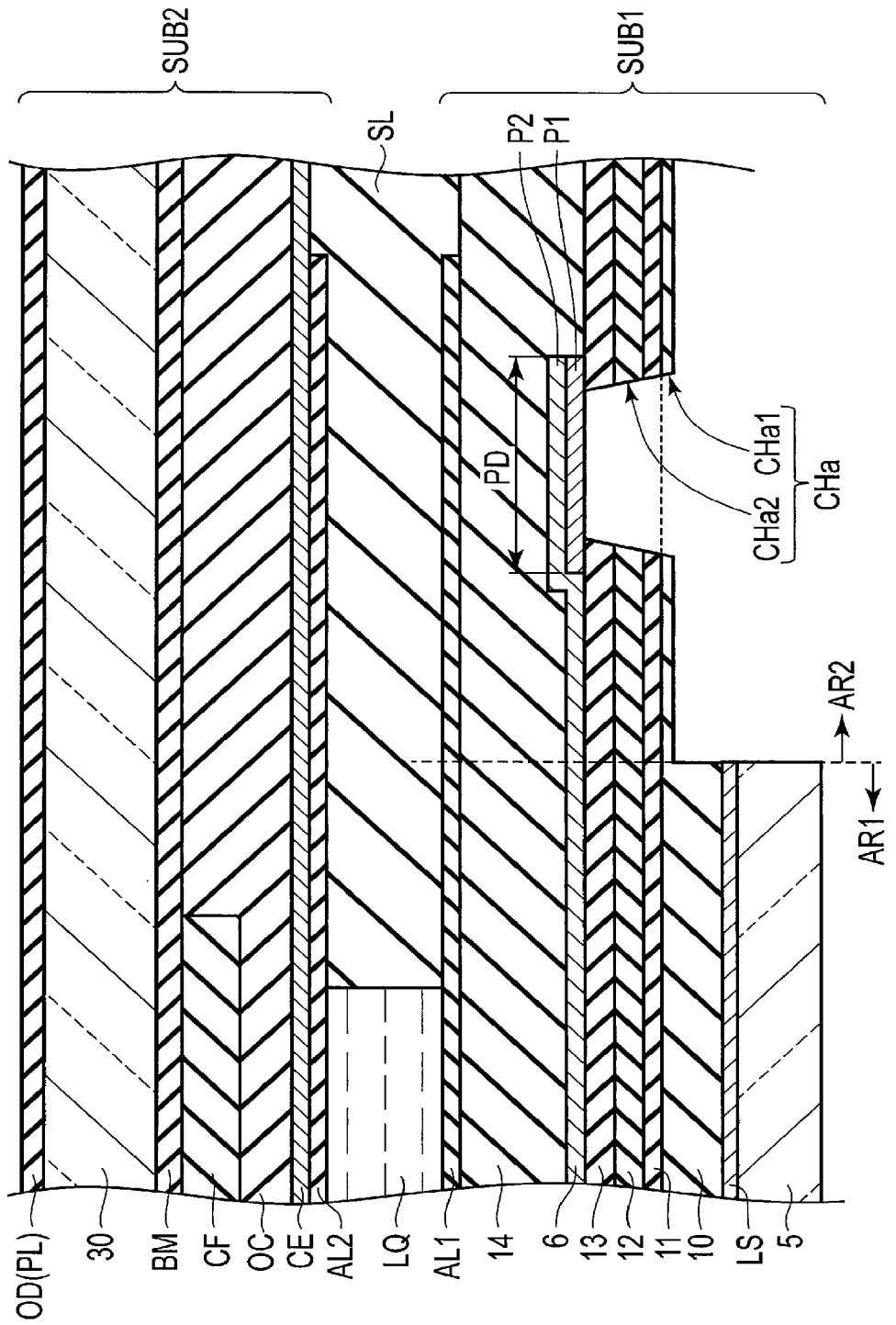
FIG. 9 is a cross-sectional view showing a third process in which the first insulating substrate is thinned in the second area and a second contact hole is formed in an interlayer insulating film after the second process of FIG. 8.

FIG. 9 is a cross-sectional view showing a third process in which the first insulating substrate 10 is thinned in the second area AR2 and a second contact hole CHa2 is formed in the insulating film IL after the second process of FIG. 8.

A second contact hole CHa2 is formed in the insulating film IL. The insulating film IL is trimmed in the first contact hole CHa1 through an ashing process to form the second contact hole CHa2. The second contact hole CHa2 is formed in a position overlapping the first contact hole CHa1. The second contact hole CHa2 continues the first contact hole CHa1. The second contact hole CHa2 functions as a second through hole. That is, the contact hole CHa includes the first contact hole CHa1 formed in the first insulating substrate 10 and the second contact hole CHa2 formed in the insulating film IL. A gas used in the ashing process is, for example, sulfur hexafluoride (SF6).

In the same process where the second contact hole CHa2 is formed, the first insulating substrate 10 is thinned in the second area AR2. Specifically, the first insulating substrate 10 exposed in the second area AR2 is trimmed by the ashing process to form the second contact hole CHa2. The first insulating substrate 10 in the first area AR1 is not trimmed since it is covered with the support substrate 5 and the light shielding mask LS therein. Thus, the thickness W2 of the first insulating substrate 10 in the second area AR2 becomes less than the thickness W1 of the first insulating substrate 10 in the first area AR1.

Here, the insulating film IL and the first insulating substrate 10 react to the gas used in the ashing process in different speeds. Furthermore, for example, the first insulating substrate 10 starts to break slower than does the insulating film IL in the ashing process. In consideration of the reaction speed of each of the insulating film IL and the first insulating substrate 10 in the ashing process, the thickness thereof before the ashing process is determined. Thus, in the second area AR2, the first insulating substrate 10 can be trimmed to desired thickness W2 during the insulating film IL is trimmed and pierced to reach the pad electrode PD.

As can be understood from the above, the process of forming the second contact hole CHa2 and the process of thinning the first insulating substrate 10 can be performed concurrently in the present embodiment. Consequently, laser-thinning of the first insulating substrate 10 is not required and the first insulating substrate 10 can be thinned without an additional process. Furthermore, the production cost can be suppressed.

Figure 10:
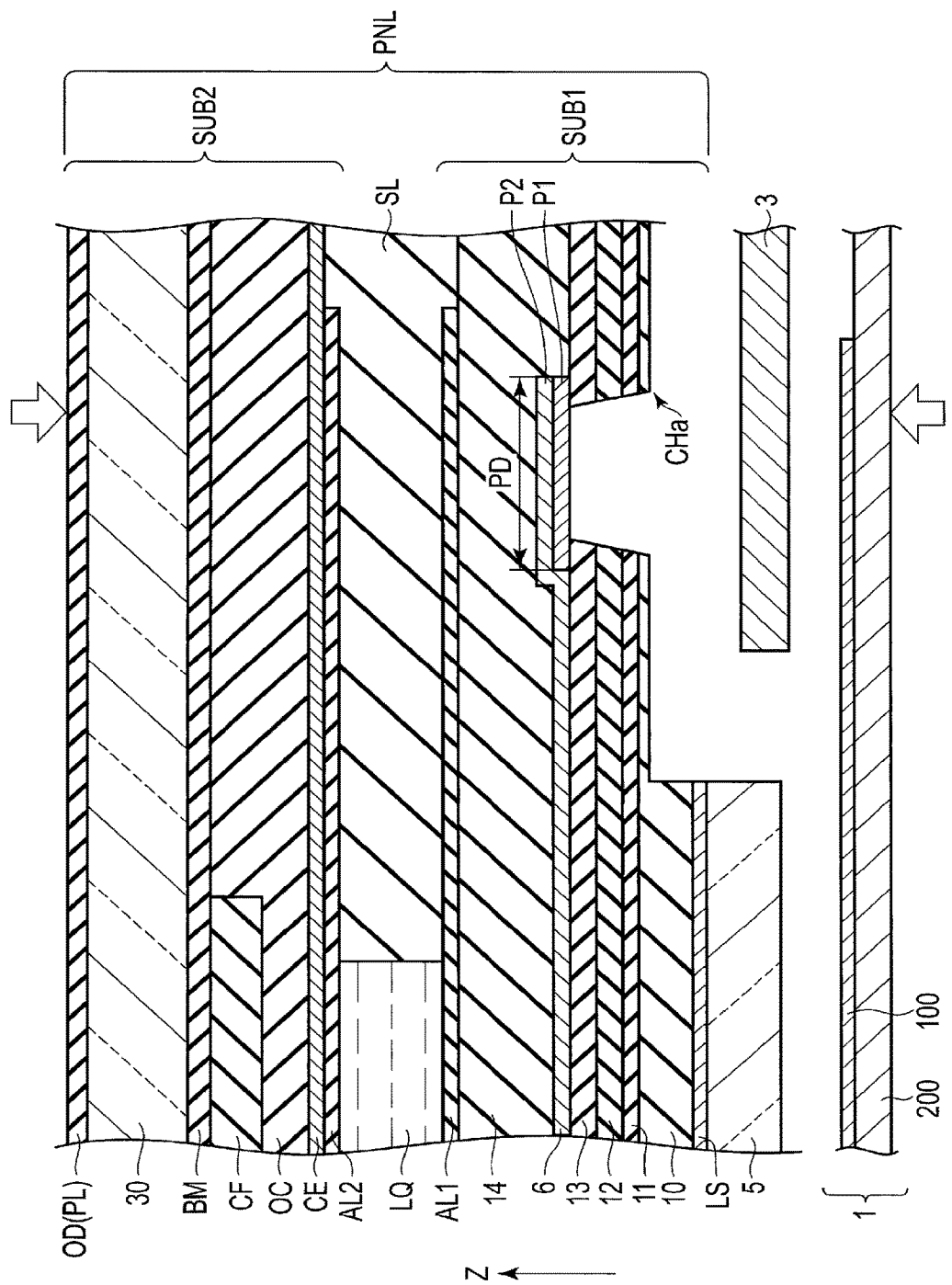
FIG. 10 is a cross-sectional view showing a fourth process in which the wiring substrate 1 is pressed to the liquid crystal display panel PNL after the third process of FIG. 9.

FIG. 10 is a cross-sectional view showing a fourth process in which the wiring substrate 1 is pressed to the liquid crystal display panel PNL after the third process of FIG. 9.

As shown in FIG. 10, after the formation of the contact hole CHa in the first substrate SUB1, the wiring substrate 1 is pressed to the liquid crystal display panel PNL using the anisotropy conductive film 3. Specifically, the anisotropy conductive film 3 is disposed between the wiring substrate 1 and the liquid crystal display panel PNL to be opposed to the contact hole CHa, and a force is applied from the lower side of the wiring substrate 1 and the upper side of the liquid crystal display panel PNL as shown by arrows in FIG. 10 and heat is applied thereto. Thereby, the anisotropy conductive film 3 melts and permeates into the contact hole CH, and conductive particles included in the anisotropy conductive film 3 contact the pad electrode PD to achieve electrical and physical connection between the wiring substrate 1 and the liquid crystal display panel PNL.

Through the above processes, the wiring substrate 1 is firmly adhered to the liquid crystal display panel PNL.

As can be understood from the above, the present embodiment can achieve a compact and thin-bezel display device.

Now, a variation 1 of the above embodiment will be explained.

Figure 11:
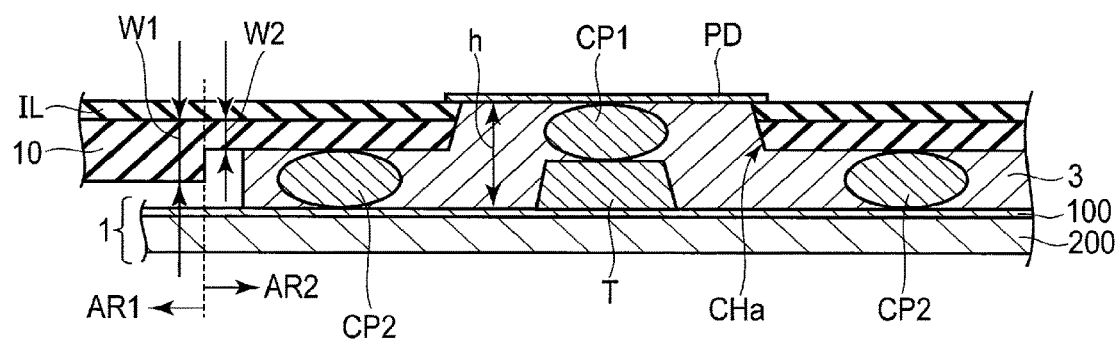
FIG. 11 is a cross-sectional view showing a part of a variation 1 of the display device in an enlarged manner, in which a wiring substrate, anisotropy conductive film, first insulating substrate, interlayer insulating film, and pad electrode are depicted.

FIG. 11 is a cross-sectional view showing a part of a variation 1 of the display device DSP in an enlarged manner, in which a wiring substrate 1, anisotropy conductive film 3, first insulating substrate 10, insulating film IL, and pad electrode PD are depicted. In the structure of FIG. 11, the connection line 100 includes a projection T, and in this respect, the structure of FIG. 11 differs from the structure of FIG. 5.

The connection line 100 includes a projection T. The projection T of the connection line 100 is formed in a position overlapping the contact hole CHa in a plan view. The projection T projects toward the first substrate SUB1. The projection T is formed such that at least a part thereof is disposed inside the contact hole CHa. The projection T is formed on, for example, the connection line 100 through plating or the like.

The conductive particle CP1 is interposed between the pad electrode PD and the projection T in the contact hole CHa. With the projection T of the connection line 100, a greater number of conductive particles CP1 can be crushed between the projection T of the connection line 100 and the pad electrode PD in contact holes CHa. Therefore, the connection line 100 and the pad electrode PD can be electrically connected with a less pressure force but more firmly. Therefore, the number of end products, productivity in the manufacturing process, and reliability can be improved.

The same advantages obtained in the embodiment can be achieved in the variation 1.

Figure 12:
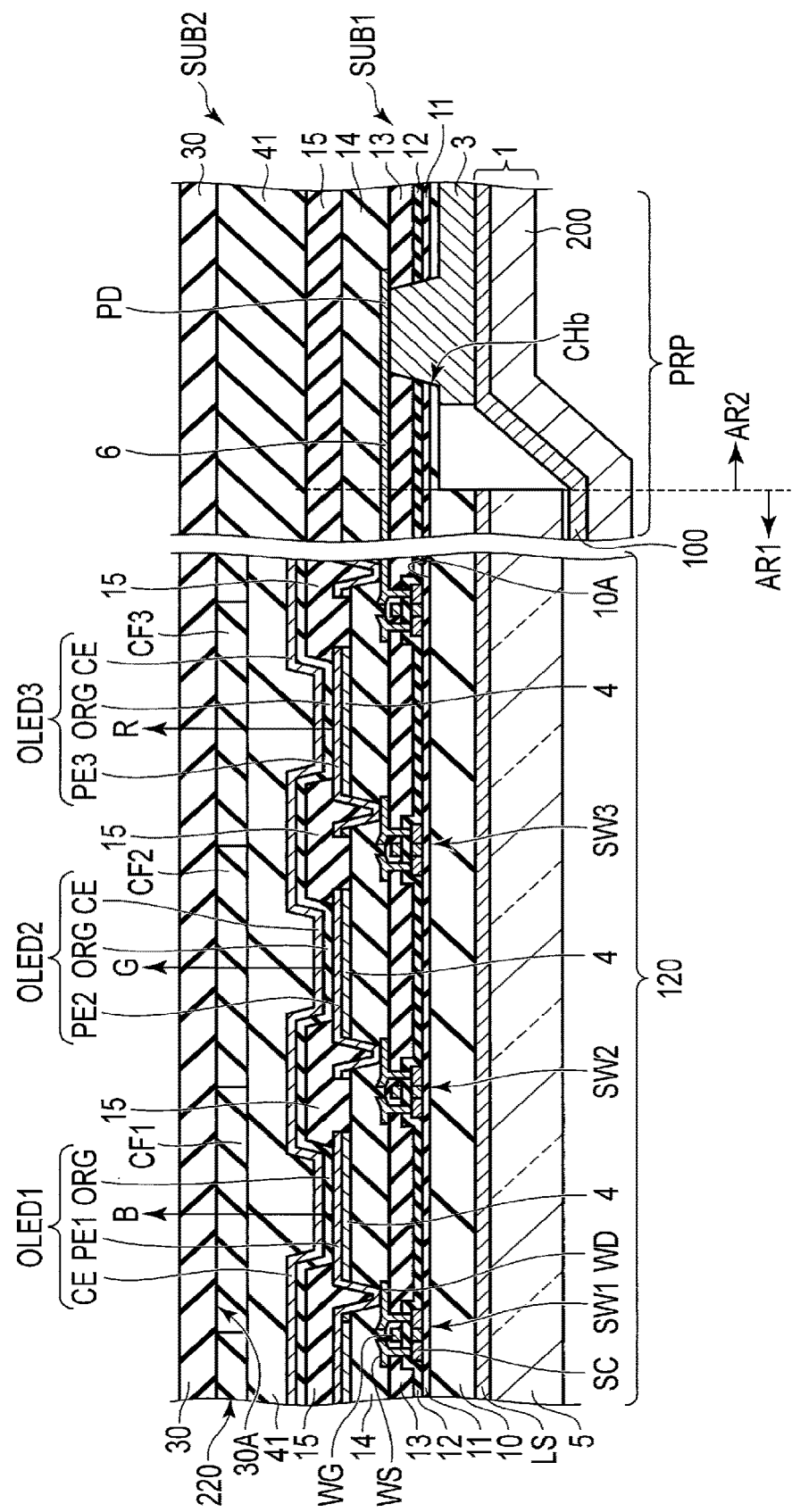
FIG. 12 is a cross-sectional view of a variation 2 of the display device of the embodiment.

FIG. 12 is a cross-sectional view of a variation 2 of the display device DSP of the above embodiment. In the example of FIG. 12, the display device is an organic electroluminescent (EL) display device.

Initially, the structure of the display device in a display element part 120 will be explained. Note that elements structured the same as those of the above example will be referred to by the same reference numbers and detailed description thereof will be omitted.

As in FIG. 12, the first substrate SUB1 includes, for example, a support substrate 5, light shielding mask LS, first insulating substrate 10, switching elements SW1, SW2, and SW3, and organic electroluminescent (EL) elements OLED1, OLED2, and OLED3. The light shielding mask LS is disposed between the support substrate 5 and the firs insulating substrate 10. Switching elements SW1 to SW3 are formed on the first insulating film 11. The reflective layer 4 is formed on the fourth insulating film 14.

Organic EL elements (light emitting elements) OLED1 to OLED3 are disposed between the first substrate SUB1 and the second substrate SUB2. Furthermore, the organic EL elements OLED1 to OLED3 are formed on the fourth insulating film 14. In the example depicted, the organic EL element OLED1 is electrically connected to the switching element SW1, the organic EL element OLED2 is electrically connected to the switching element SW2, and the organic EL element OLED3 is electrically connected to the switching element SW3. Each of the organic EL elements OLED1 to OLED3 is structured as a top-emission type which emits whit light toward the second substrate SUB2. The organic EL elements OLED1 to OLED3 have the same structure.

The organic EL elements OLED1 includes a positive electrode PE1 formed on the reflective layer 4. The positive electrode PE1 contacts the drain electrode WD of the switching element SW1 and is electrically connected to the switching element SW1. Similarly, the organic EL element OLED2 includes a positive electrode PE2 which is electrically connected to the switching element SW2 and the organic EL element OLED3 includes a positive electrode PE3 which is electrically connected to the switching element SW3.

The organic EL elements OLED1 to OLED3 each include an organic light emitting layer ORG and a common electrode (negative electrode) CE. The organic light emitting layer ORG is disposed to correspond to each of the positive electrodes PE1 to PE3. The common electrode CE is positioned above the organic light emitting layer ORG. In the example depicted, the organic EL elements OLED1 to OLED3 are defined by ribs 15. Note that, although this is not depicted, each of the organic EL elements OLED1 to OLED3 is, preferably, sealed by a transparent shielding film.

The display element part 120 is an area of the first substrate SUB1 in which a plurality of switching elements and organic EL elements OLED are arranged, and thus, the display element part 120 is a substantial display area for the image display.

The second substrate SUB2 includes a color filter layer 220 and the like on the inner surface 30A side of the second insulating substrate 30. The color filter layer 220 includes color filters CF1, CF2, and CF3. The color filter CF1 is opposed to the organic EL element OLED1 and is a blue color filter which passes light of blue wave length in white light. The color filter CF2 is opposed to the organic EL element OLED2 and is a green color filter which passes light of green wave length in white light. The color filter CF3 is opposed to the organic EL element OLED3 and is a red color filter which passes light of red wave length in white light.

The display element part 120 of the first substrate SUB1 and the second substrate SUB2 are adhered together by a transparent adhesive layer 41.

In the above display device, when the organic EL elements OLED1 to OLED3 emit light, the light (white light) irradiated from the elements OLED1 to OLED3 exits through the color filters CF1, CF2, and CF3. Therein, the light of blue wave length in the white light irradiated from the organic EL element OLED1 passes the color filter CF1. Additionally, the light of green wave length in the white light irradiated from the organic EL element OLED2 passes the color filter CF2, and the light of red wave length in the white light irradiated from the organic EL element OLED3 passes the color filter CF3. Therefore, color image display can be achieved.

Now, the structure of the display device in a bezel area PRP will be explained.

The first substrate SUB1 includes, for example, the support substrate 5, light shielding mask LS, first insulating substrate 10, pad electrode PD, signal line 6, and third spacer SP3. The first insulating substrate 10 has a thickness W1 in the first area AR1 and a thickness W2 in the second area AR2. The thickness W2 is less than the thickness W1. A contact hole CHb is formed to pass through the first insulating substrate 10, first insulating film 11, second insulating film 12, and third insulating film 13 to reach the pad electrode PD. The contact hole CHb corresponds to a through hole including the above first through hole and second through hole. The wiring substrate 1 is disposed in the rear surface side of the first substrate SUB1. The pad electrode PD and the connection line 100 of the wiring substrate 1 are electrically connected together through the anisotropy conductive film 3. Note that the contact hole CHb is disposed in a position overlapping the adhesive layer 41.

The same advantages obtained in the above embodiment can be achieved in such an organic EL display device of the variation 2.

Now, a comparative example of the display device will be explained.

Figure 13:
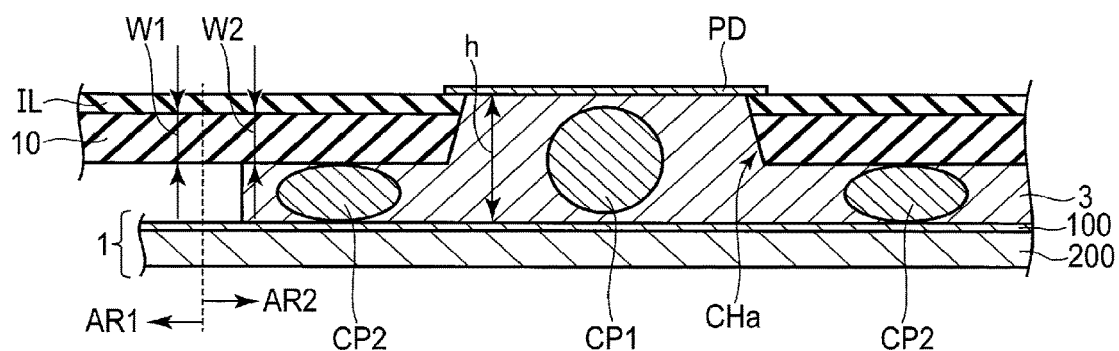
FIG. 13 is a cross-sectional view showing a part of a comparative example of the display device, in which a wiring substrate, anisotropy conductive film, first insulating substrate, interlayer insulating film, and pad electrode are depicted.

FIG. 13 is a cross-sectional view showing a part of a comparative example of the display device DSP, in which a wiring substrate 1, anisotropy conductive film 3, first insulating substrate 10, insulating film IL, and pad electrode PD are depicted.

As shown in FIG. 13, in the display device of the comparative example, the first insulating substrate 10 has a thickness W2 in a second area AR2 size of which is substantially equal to its thickness W1 in a first area AR1. In this respect, the comparative example of FIG. 13 differs from the embodiment of FIG. 5.

Specifically, when conductive particles CP2 are lodged in between the connection line 100 and the first insulating substrate 10, a height h between the pad electrode PD and the connection line 100 is greater than that of the example of FIG. 5. In this state, the conductive particle CP1 does not contact the pad electrode PD or the connection line 100. That is, in the comparative example of FIG. 13, the height h is not sufficiently decreased to crush the conductive particle CP1. Furthermore, in this state, the conductive particles CP1 are unstable in the periphery of the pad electrode PD, and the density thereof is decreased. Thus, if a display device DSP of the comparative example in which the thickness W1 and the thickness W2 are equal, improved connection between the connection line 100 and the pad electrode PD is difficult to achieve.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the above insulating film IL includes the first insulating film 11, second insulating film 12, and third insulating film 13; however, no limitation is intended thereby. Various changes can be applied thereto. For example, the insulating film IL may be a monolayer insulating film, or may be a double-layered insulating film, or may be an insulating film including four or more layers.

Furthermore, the insulating film IL may not be interposed between the first insulating substrate 10 and the pad electrode PD. In that case, the pad electrode PD is formed on the first insulating substrate 10.

What is claimed is:

1. A display device comprising:
a first substrate including a first area, a second area adjacent to the first area, an insulating substrate disposed in the first area and the second area and including a first through hole formed in the second area, a pad electrode formed above the insulating substrate, and a signal line electrically connected to the pad electrode;
a wiring substrate including a connection line, the wiring substrate disposed below the insulating substrate; and
a conductive material disposed inside the first through hole to electrically connect the pad electrode and the connection line, wherein
the insulating substrate becomes thinner in the second area than is in the first area.

2. The display device of claim 1, wherein the first substrate further includes an insulating film between the insulating substrate and the pad electrode, and the insulating film has a second through hole in a position overlapping the first through hole.

3. The display device of claim 2, wherein the insulating film is an inorganic insulating film.

4. The display device of claim 3, wherein the insulating film includes at least a first insulating film and a second insulating film, and the first insulating film and the second insulating film are formed of different materials.

5. The display device of claim 1, wherein the insulating substrate in the second area has a thickness which is 1 µm or less.

6. The display device of claim 1, wherein the first substrate further includes a support substrate, and the support substrate is disposed in the first area.

7. The display device of claim 6, wherein the support substrate is formed of glass.

8. The display device of claim 1, further comprising:
a second substrate disposed above the first substrate and opposed to the first substrate;
a liquid crystal layer interposed between the first substrate and the second substrate; and
a sealant used to adhere the first substrate and the second substrate together, wherein the sealant is formed in a position overlapping the first through hole.

9. The display device of claim 1, wherein the insulating substrate is formed of polyimide.

10. The display device of claim 1, wherein the pad electrode includes a first electrode contacting the conductive material, and the first electrode is a transparent conductive layer.

11. The display device of claim 7, wherein the pad electrode includes a second electrode disposed on the first electrode, and the second electrode is formed of a metal material.

12. The display device of claim 1, further comprising:
a second substrate disposed above the first substrate and opposed to the first substrate;
a light emitting element disposed between the first substrate and the second substrate; and
an adhesive layer used to adhere the first substrate and the second substrate together, wherein
the adhesive layer is formed in a position overlapping the first through hole.

13. The display device of claim 1, wherein the insulating substrate in the first area has a first lower surface and the insulating substrate in the second area has a second lower surface, where the second lower surface is above the first lower surface.

14. The display device of claim 1, wherein the insulating substrate in the first area has a first lower surface which contacts a light shield and the insulating substrate in the second area has a second lower surface which contacts the conductive material.

* * * * *